United States Patent
Cheng

(10) Patent No.: US 9,215,834 B2
(45) Date of Patent: Dec. 15, 2015

(54) HIGH-FREQUENCY SIGNALS DOUBLE-LAYER FLAT CABLE ADAPTER CARD

(71) Applicant: Liang-Ho Cheng, Taoyuan County (TW)

(72) Inventor: Liang-Ho Cheng, Taoyuan County (TW)

( * ) Notice: Subject to any disclaimer, the term of this patent is extended or adjusted under 35 U.S.C. 154(b) by 0 days.

(21) Appl. No.: 14/403,635

(22) PCT Filed: Mar. 25, 2013

(86) PCT No.: PCT/CN2013/000341
§ 371 (c)(1),
(2) Date: Nov. 25, 2014

(87) PCT Pub. No.: WO2014/015644
PCT Pub. Date: Jan. 30, 2014

(65) Prior Publication Data
US 2015/0136469 A1    May 21, 2015

(30) Foreign Application Priority Data

Jul. 23, 2012    (CN) .......................... 2012 1 0254688

(51) Int. Cl.
| H01R 13/648 | (2006.01) |
| H05K 9/00 | (2006.01) |
| H01R 12/59 | (2011.01) |
| H01R 4/04 | (2006.01) |
| H01R 13/658 | (2011.01) |
| H01B 7/02 | (2006.01) |
| H01B 7/08 | (2006.01) |
| H01B 11/00 | (2006.01) |
| G06F 13/40 | (2006.01) |

(52) U.S. Cl.
CPC ............ *H05K 9/0088* (2013.01); *G06F 13/409* (2013.01); *H01B 7/0258* (2013.01); *H01B 7/0846* (2013.01); *H01B 11/00* (2013.01); *H01R 4/04* (2013.01); *H01R 12/592* (2013.01); *H01R 12/594* (2013.01); *H01R 13/658* (2013.01)

(58) Field of Classification Search
CPC ...................................................... H01R 12/594
USPC ................................................... 174/359, 34
See application file for complete search history.

(56) References Cited

U.S. PATENT DOCUMENTS

| 3,757,029 A * | 9/1973 | Marshall ................. H01B 7/08 |
| | | 174/117 F |
| 4,155,613 A * | 5/1979 | Brandeau ............... H01B 11/06 |
| | | 174/117 F |

(Continued)

*Primary Examiner* — Hung V Ngo
(74) *Attorney, Agent, or Firm* — Rosenberg, Klein & Lee

(57) ABSTRACT

A high-frequency signal double-layer flat cable adapter card that is capable of eliminating transmission disorder of a double-layer cable caused by paralleling and overlap of high-frequency signals and a direct current power supply loop. The high-frequency double-layer flat cable adapter card comprises a first connecting end, a second connecting end and a flat cable group formed by at least two strips of flat cables. The first connecting end includes a first substrate and a connector. The second connecting end includes a second substrate. The flat cable group is in an upper-lower dual-layer structure and is connected between the first connecting end and the second connecting end. A conductive metal foil sheet is arranged between upper and lower dual layers of flat cables of the flat cable group. The width of the metal foil sheet must cover areas of the flat cable group adopted as a power supply loop to isolate the magnetic field effect of the areas of the upper and lower dual layers of flat cables adopted the power supply loop.

7 Claims, 10 Drawing Sheets

(56) References Cited

U.S. PATENT DOCUMENTS

| | | | | |
|---|---|---|---|---|
| 4,209,215 | A * | 6/1980 | Verma | H01B 7/0838 174/117 FF |
| 4,644,092 | A * | 2/1987 | Gentry | H01B 7/0838 174/102 C |
| 4,971,574 | A * | 11/1990 | Garcia | H01R 23/662 439/497 |
| 5,235,132 | A * | 8/1993 | Ainsworth | H01B 7/0861 156/55 |
| 6,930,240 | B1 * | 8/2005 | Giboney | H01R 13/65802 174/36 |
| 7,154,050 | B2 * | 12/2006 | Sekijima | H01R 23/6873 174/369 |
| 8,416,567 | B2 * | 4/2013 | Cheng | G06F 1/184 361/679.02 |
| 2004/0075165 | A1 * | 4/2004 | Frutschy | H01L 23/50 257/689 |
| 2007/0095552 | A1 * | 5/2007 | Thierolf | H01B 7/0861 174/36 |
| 2008/0236868 | A1 * | 10/2008 | Koga | H01B 7/0861 174/117 F |
| 2009/0166082 | A1 * | 7/2009 | Liu | H01B 7/0823 174/359 |

* cited by examiner

HIGH-FREQUENCY SIGNALS DOUBLE-LAYER FLAT CABLE ADAPTER CARD

BACKGROUND OF THE INVENTION (a) Field of the Invention

The present invention relates to a flat cable, particularly to a double-layer flat cable adapter card that is capable of eliminating transmission disorder of a double-layer cable caused by paralleling and overlapping of high-frequency signals and a DC supply loop.

(b) Description of the Related Art

In various electronic products such as computers and televisions, flat cables are mostly used as connecting wires between the mainboard and peripheral devices. However, as technology advances, standards in transmission architectures are getting higher, and then it brings about a product made of flat cable with components individually wrapped in insulating materials. Nevertheless, whenever there is a demand for higher standards of signal transmission, the technology would encounter a bottleneck. Among all types of flat cables, there is one that made of Flexible Print Circuit. It is more stable in transmission process, but costs higher and has weaker bending resistance than ordinary flat cables with components wrapped individually in insulating materials, and therefore its applicability in practical fields is restricted.

Hence, a cable connecting product of flat cables with components individually wrapped in insulating materials is able to break the bottleneck in high frequency signals transmission and enhance the efficiency. Such products have excellent flexibility and cost much lower price than the Flexible Print Circuit, leading to more possibilities of applicability.

As shown in FIG. 1A, a schematic diagram of a conventional flexible cable 10A, a plurality of conductive wires 11 are compressed and molded by an insulating film 13 with an adhesive layer 12 in-between. Such flexible cable 10A can satisfy general electrical connection for transmission, but as new electronic products keep showing up, there comes a demand for higher speed in signal transmission. The conventional flexible cable 10A can no longer satisfy the need.

With reference to FIG. 1B, a conventional flexible cable includes an upper-lower dual layer flat cables 10A, 10B. It has an advantage of reducing the length of a connector (not shown), and increasing transmission circuits with the feature that a connector can electrically connect via both sides, forming a high frequency signals transmitting flat cables of four flat cables with a twofold overlapping flat cables paralleling to another one in needed situation.

With such high speed of signal transmission with the conventional high frequency flat cable 10, it is necessary to hold control of impedance and field loss. In present techniques, shielding, ground connection, magnetic loop effect, and upgrades connectors are main measures. Arranging high frequency signals processing electrical components with capacitance, inductance, or reactance function on the circuit board is another way.

Measures mentioned above do have their functions in previous electronic products, but as the demand for standards of transmission speed increases, the technical architecture is upgrading from PCIe 2.0 to PCIe 3.0 as well.

To sum up, a PCIe system bus will become a new standard and a signal channel linking processors and external devices. When it comes to PCIe, mostly people think of display cards. However, data such as USB, sound effects, and internet are also transmitted via PCIe or other similar equipment. Therefore, as the transmission of this channel is faster and the bandwidth is wider, the speed and amount of data transmission are higher and more.

The so called PCI Express, as PCIe for short, is a type of computer system bus that inherits the program concepts and communication standards and is further established on a faster serial communication system. PCIe has a higher transmission rate, which means it transmits faster, to replace current internal system bus including AGP and PCI, and does not need external power supply. The electricity it needs is from the slots which have DC supply loops, compatible with three different voltages of +3.3V, 3.3 Vaux, and 12V. This also brings the users more convenience.

FIG. 1C is a schematic diagram of a PCI Express 3.0 system bus in which the area Z (connecting pins 1~18) is the most important section. FIG. 1D is a function description of connecting pins 1~18 in area Z. From FIGS. 1C and 1D it is concluded that the PCIe 3.0 directly draws electricity from slots which have DC supply loops and multiple important ground connection within area Z (12V). As for FIG. 1E, it is a function description of connecting pins 19~32 of PCIe 3.0.

Yet, currently the PCIe 3.0 system bus is merely applicable to connecting peripheral devices such as display cards with mainboards. There is no flat cable adapter (card) in PCIe 3.0 architecture for practical usages.

For instance, there is an adapter of PCIe x16 to connect the circuit boards and peripheral devices in the U.S. Pat. No. 8,416,567. However, during process of merchandising, a crucial problem occurred. The transmission architecture of the most common peripheral devices, display cards, was upgrading from PCIe 2.0 to PCIe 3.0, whereupon the completed PCIe 2.0 adapter could not initiate the display cards built in PCIe 3.0 architecture. The core reason is that, current transmission structure of PCI Express adapter merely focuses on arranging ground connection pins in pairs to isolate the interfering effects within the area where I/O signals exchange back and forth in high frequency speed, and overlooks the transmission loop responsible for detecting and initializing is also transmitted via high frequency I/O signals. The overlooking leads to an arrangement of ground connection pins without pairing and a continual magnetic field effect resulted from the DC supply loop parallel set aside. Thus, when there is a need of transmission adapter, as the U.S. Pat. No. 8,416,567 had, a parallel double-layer flat cable is applied in order to connect the contacting surfaces on both front and rear sides of the circuit boards, causing an increasing exchange rate of I/O signals interfered by a magnetic effects of DC supply loop with fixed intensity further disables the transmission loop responsible for detecting and initializing via high frequency I/O signals initializing the new PCIe 3.0 which has twice times the transmission rate as the previous architecture has. This is because the unpaired arrangement of ground connection pins that cannot isolate the interference from the near magnetic effect area of DC supply loop.

In summation of above, there is yet a double layer flat cable adapter designed for PCIe 3.0. Even though an adapter card made of Flexible Print Circuit types is applicable, such device still has disadvantages of higher cost and weaker resistance in bending than a double layer flat cable; the applicability would be limited.

In consideration of aforesaid problems occur in high speed transmission of conventional flexible cables, the main object of the present invention is to find a solution to them.

SUMMARY OF THE INVENTION

The primary object of the present invention is to provide a high-frequency signal double-layer flat cable adapter card that can break the bottleneck of 8 Gb/s in transmission bandwidth and has features of transmitting high frequency signals without distortion of transmission characteristics, excellent flexibility and bending resistance, and low cost.

The present invention is a double-layer flat cable adapter card that is capable of eliminating transmission disorder of a double-layer cable caused by paralleling and overlapping of high-frequency signals and a DC supply loop, comprising a first connecting end, including a first substrate and a connector; said first substrate has a first connecting pin and a second connecting pin set on its front and rear sides respectively;

a second connecting end, including a second substrate with a third connecting pin and a fourth connecting pin set on its front and rear sides respectively;

a flat cable group including a minimum of two flat cables arranged as upper-lower double layer and connected between a first and second connecting ends; said first flat cable, as the upper layer, has its front and back ends electrically connected to the first connecting pin of said first substrate and the third connecting pin of said second substrate respectively, and the second flat cable, as the lower layer, has its front and back ends electrically connected to the second connecting pin of said first substrate and the fourth connecting pin of said second substrate respectively;

wherein a fine conductive metal foil sheet is arranged between the upper and lower flat cables of said flat cable group, with a width covering areas of said flat cable group adopted as a power supply loop to isolate the magnetic field effect in the areas of said upper and lower flat cables adopted as a power supply loop; and a conductive adhesive tape with high frequency shielding effects wraps the entire double-layer flat cable group to minimize the loss of high frequency signals.

According to features disclosed above, the conductive metal foil sheet is made of cooper with adhesive on either side of it.

In addition, the flat cable group could be not only constructed of two flat cables but could be further constructed of four flat cables as a third flat cable, as the upper layer, and a fourth flat cable, as the lower layer, set parallel to said upper-lower double layer flat cable group of said first and second flat cable, so as to construct a high-frequency signal adapter of four flat cables with a paralleling twofold flat cable group, each has two overlapping flat cables.

Furthermore, a conductive metal foil sheet could be arranged between the third and fourth flat cables if need be.

The inner side of the conductive adhesive tape has insulation layers on both sides relative to the connecting pins of the first and second connecting ends, and the insulation layers are made of an insulating tape.

As stated above, the present invention disperses the magnetic field effects caused by the DC supply loop via the conductive metal foil sheet, and conducts into ground wires, so as to eliminate the most influential factor that may affect I/O signals and minimize high-frequency signals loss due to outward sending process by means of wrapping the double-layer flat cable with a conductive adhesive tape which has a high frequency shielding effect. Caused by high-frequency signals passing through the magnetic field of power supply loop that is too close, the transmission disorder of high-frequency signal double-layer flat cable adapter card with higher transmission rate is effectively eliminated with aforesaid measures.

DETAILED DESCRIPTION OF THE PREFERRED EMBODIMENT

Figure 1B:
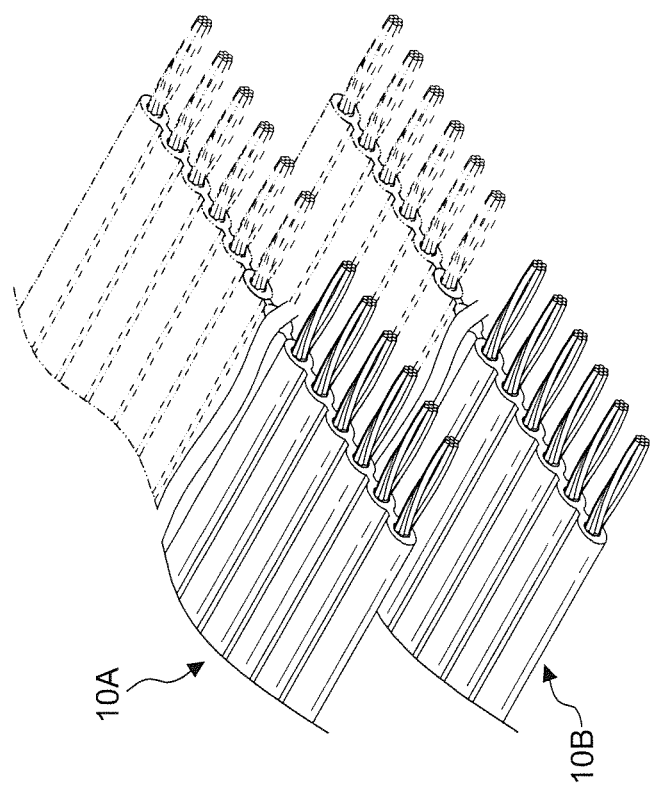
FIG. 1B is a schematic diagram of a conventional double-layer flexible cable.
Figure 1A:
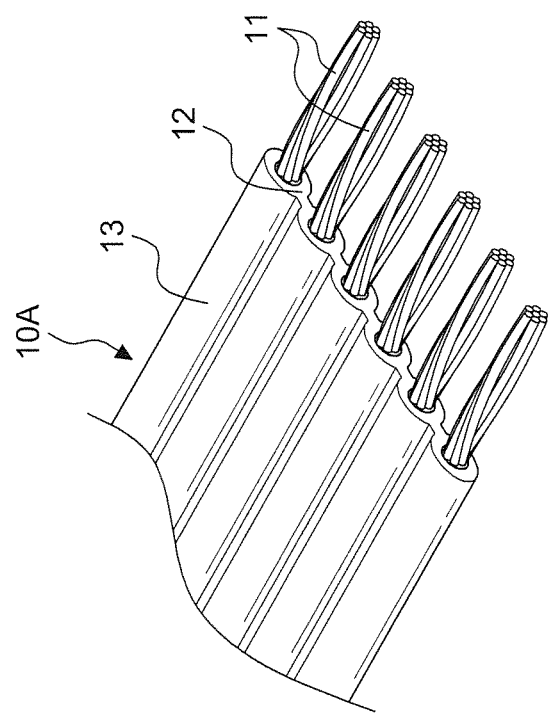
FIG. 1A is a schematic diagram of a conventional flexible cable.
Figures 1C, 1D, 1E:
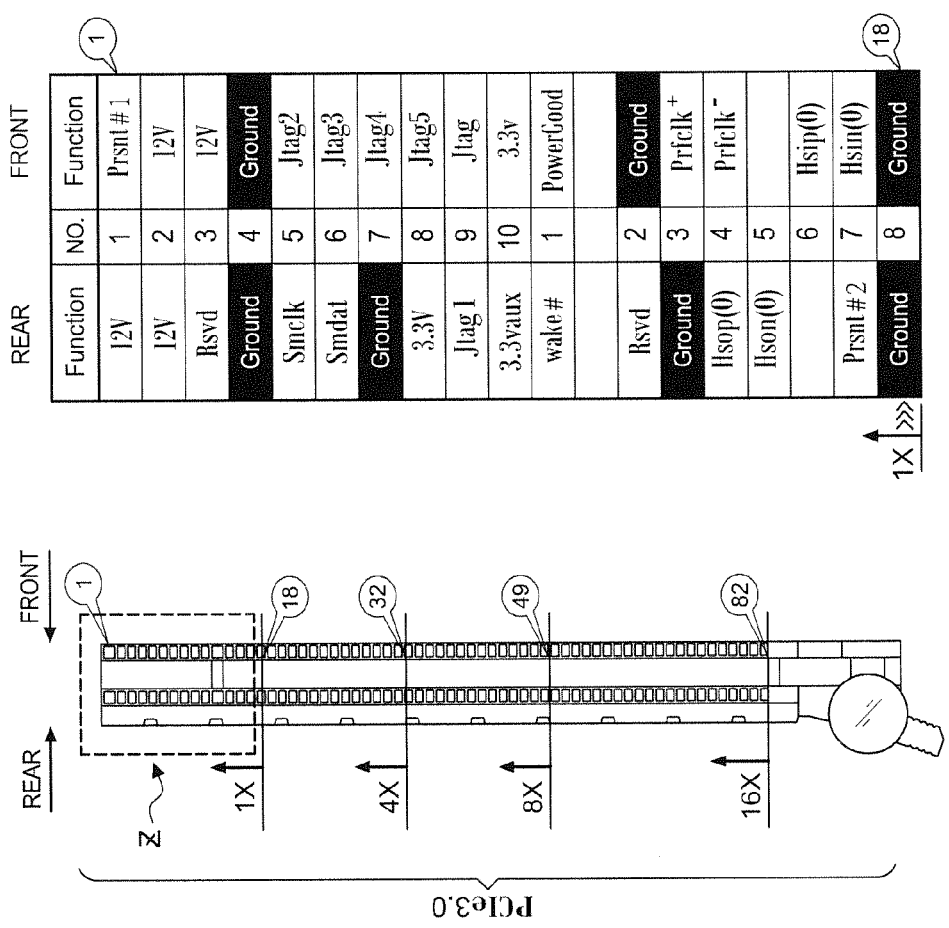
FIG. 1C is a schematic diagram of PCIe system bus.
FIG. 1D is a description of connecting pins 1~18 within area Z in FIG. 1C.
FIG. 1E is a description of connecting pins 19~32 in FIG. 1C.

Referring to FIGS. 2-7, the present invention, a high frequency signal double-layer flat cable adapter card 20 is to apply a flexible cable with components individually wrapped in insulating materials as a transmission line which has excellent flexibility and bending resistance with low cost. A preferred embodiment of the present invention comprises elements as below.

A first connecting end 30, including a first substrate 31 and a connector 34; said first substrate 31 has a first connecting pin 32 and a second connecting pin 33 set on its front and rear sides respectively.

In addition, the present invention also has a second connecting end 40, including a second substrate 41 with a third connecting pin 42 and a fourth connecting pin 43 set on its front and rear sides respectively; and Furthermore, a flat cable group 50 is included as well. It includes a minimum of two flat cables 51, 52 arranged as upper-lower double layer and connected between said first and second connecting ends 30, 40; wherein said first flat cable 51, as the upper layer, has its front and back ends electrically connected to the first connecting pin 32 of said first substrate 31 and the third connecting pin 42 of said second substrate 41 respectively, and the second flat cable 52, as the lower layer, has its front and back ends electrically connected to the second connecting pin 33 of said first substrate 31 and the fourth connecting pin 43 of said second substrate 41 respectively. However, the present invention is not limited to above construction; that is, the double-layer flat cable adapter card 20 could include two flat cables arranged as upper-lower double layer, or it could include four flat cables as a third flat cable 53, as the upper layer, and a fourth flat cable 54, as the lower layer, set parallel to said upper-lower double layer flat cable group of said first and second flat cable 51, 52, so as to construct flat cable group 50 with a paralleling twofold flat cable group, each has two overlapping flat cables. With such device constructed in accordance with prior art, the present invention has further features as below.

A fine conductive metal foil sheet 60 is arranged between the upper and lower flat cables 51, 52 of said flat cable group 50, with a width W covering the area Z (connecting pins 1-18) of said flat cable group 50 adopted as a power supply loop to isolate the upper and lower flat cables 51, 52 within the area. In the preferred embodiment, the flat cable group 50 between the first connecting end 30 and second connecting end 40 contains four flat cables as a third flat cable 53, as the upper layer, and a fourth flat cable 54, as the lower layer, set parallel to said upper-lower double layer flat cable group of said first and second flat cable 51, 52, so as to construct a double-layer flat cable adapter card 20 of four flat cables with a paralleling twofold flat cable group, each has two overlapping flat cables to transmit high-frequency signals; And the width W of the conductive metal foil sheets 60 is flexible if need be.

Figure 2:
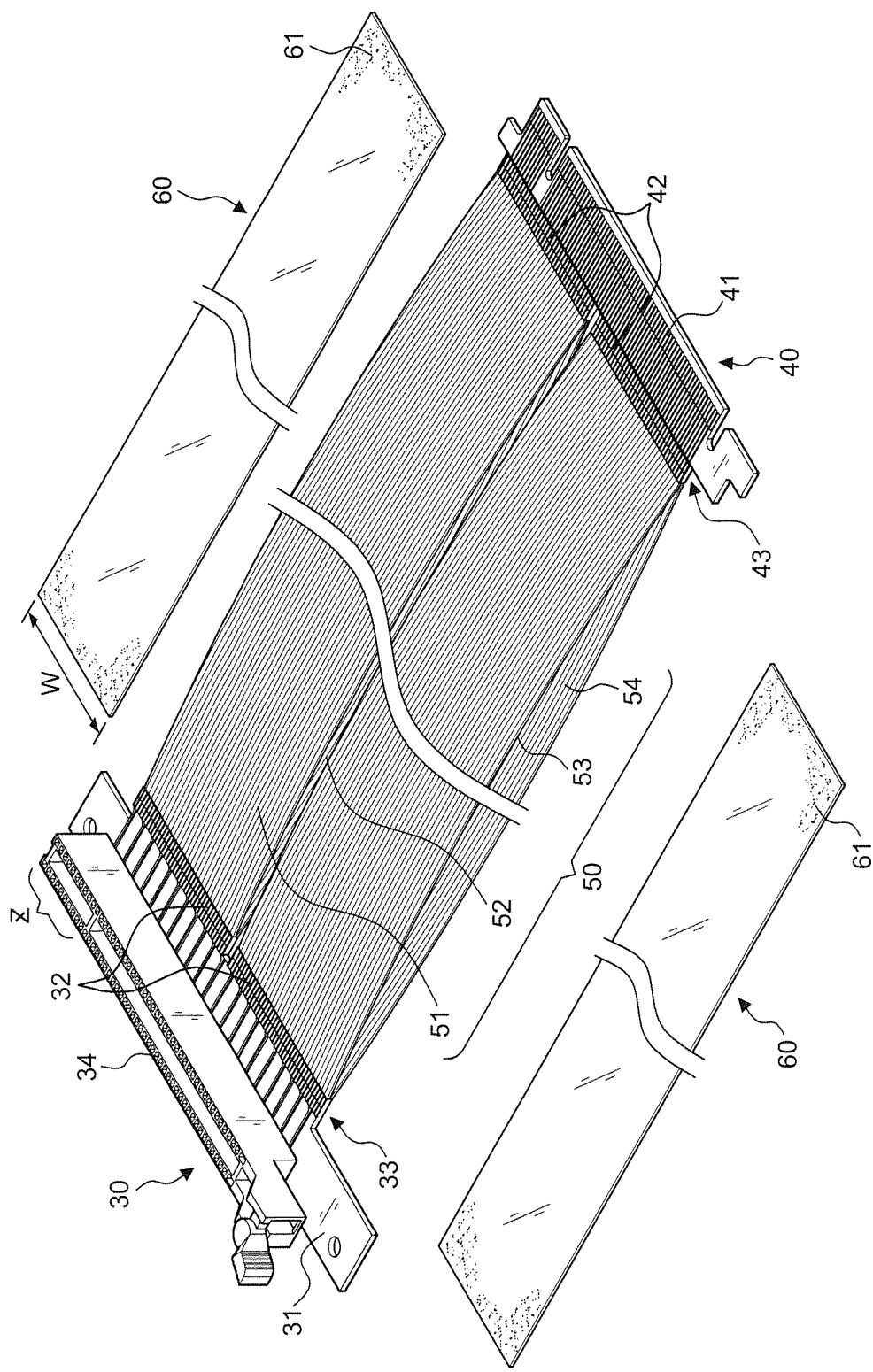
FIG. 2 is an exploded view of the conductive metal foil sheets described in the preferred embodiment of the present invention.
Figure 3:
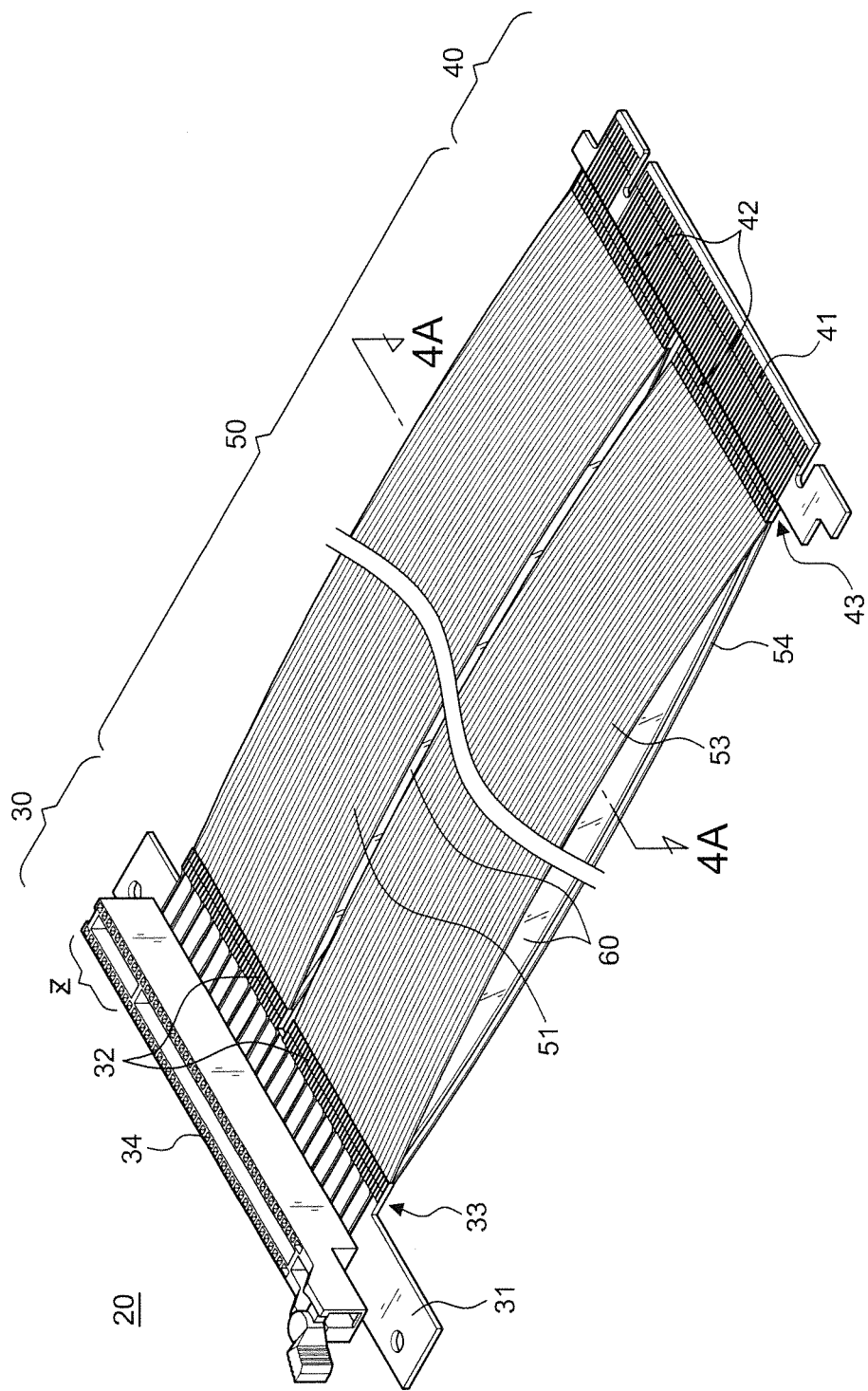
FIG. 3 is a perspective view of the conductive metal foil sheets in FIG. 2 arranged between the upper and lower flat cables.
Figure 4A:
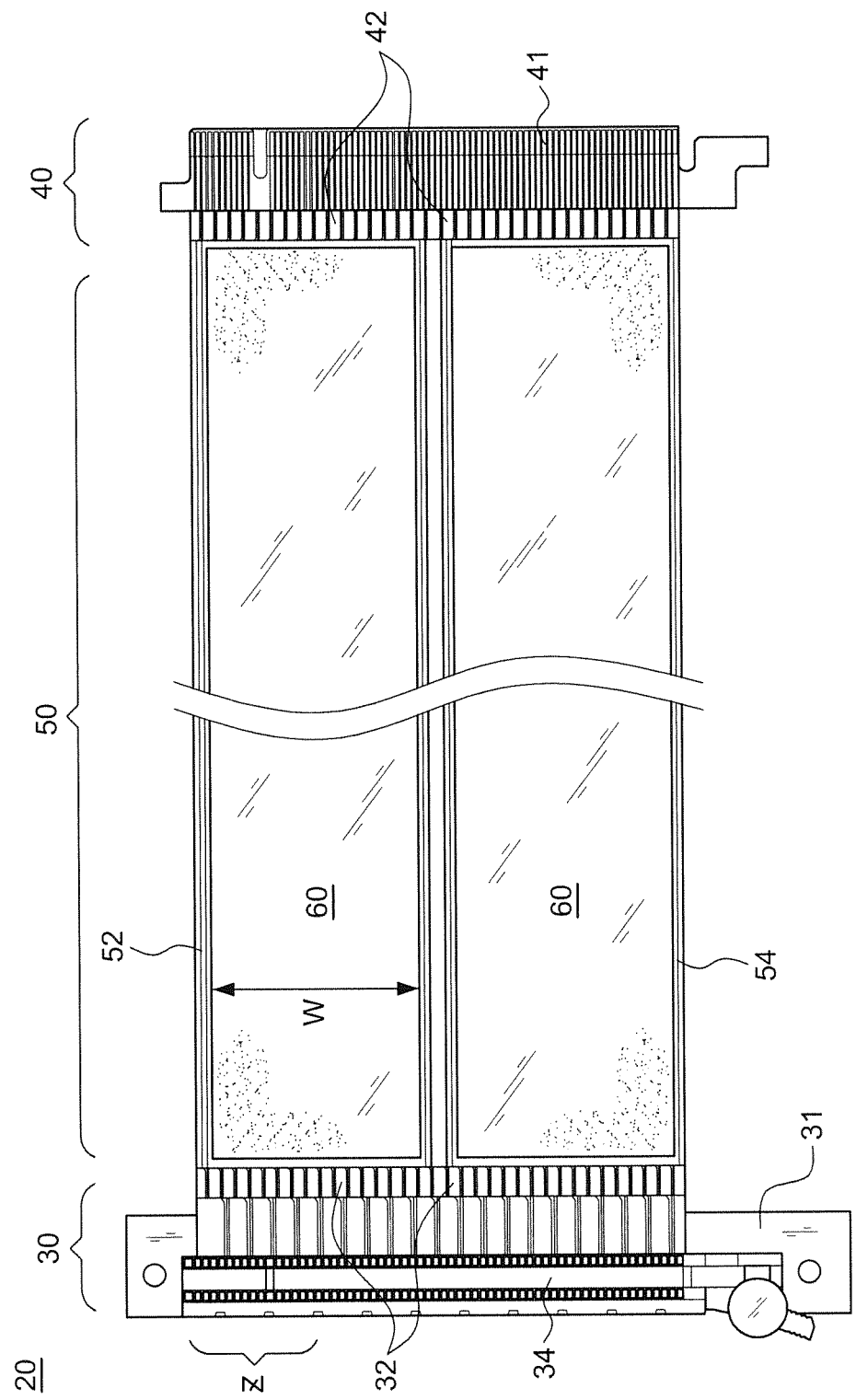
FIG. 4A is a cross-section view taken along line 4A-4A in FIG. 3.
Figure 4B:
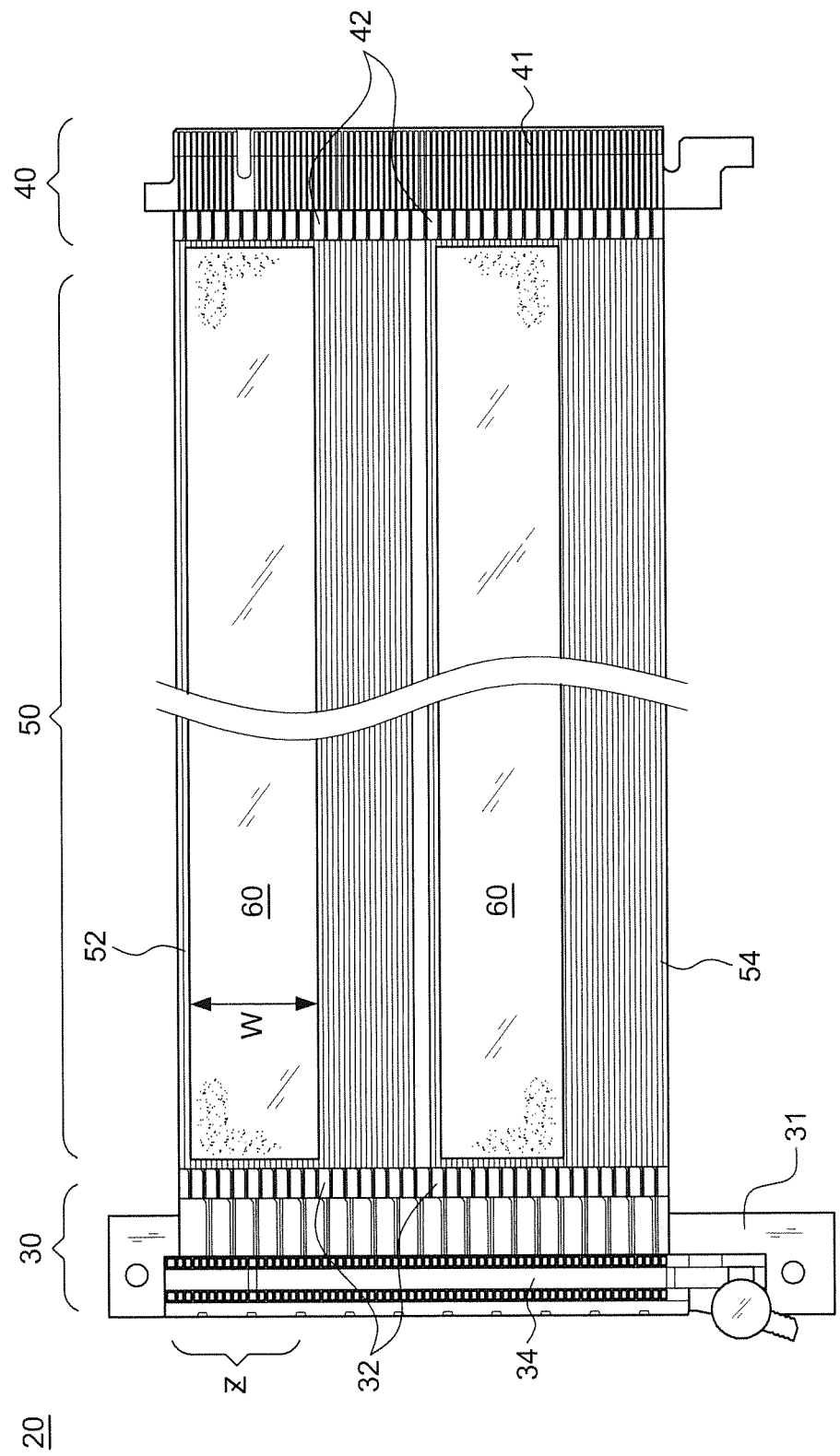
FIG. 4B is another embodiment of setting said conductive metal foil sheets in the present invention.
Figure 4C:
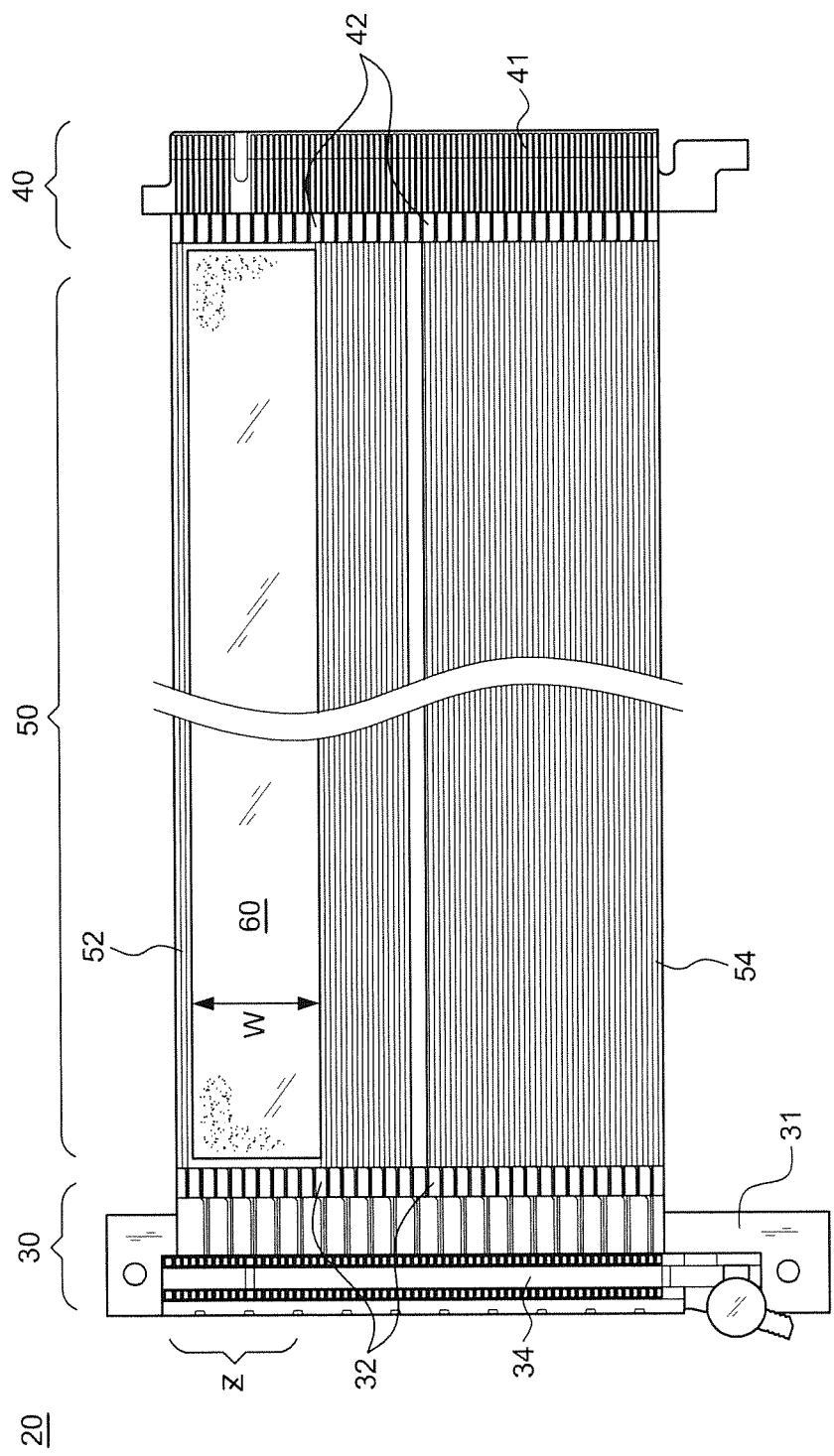
FIG. 4C is yet another embodiment of setting said conductive metal foil sheet in the present invention.
Figure 5:
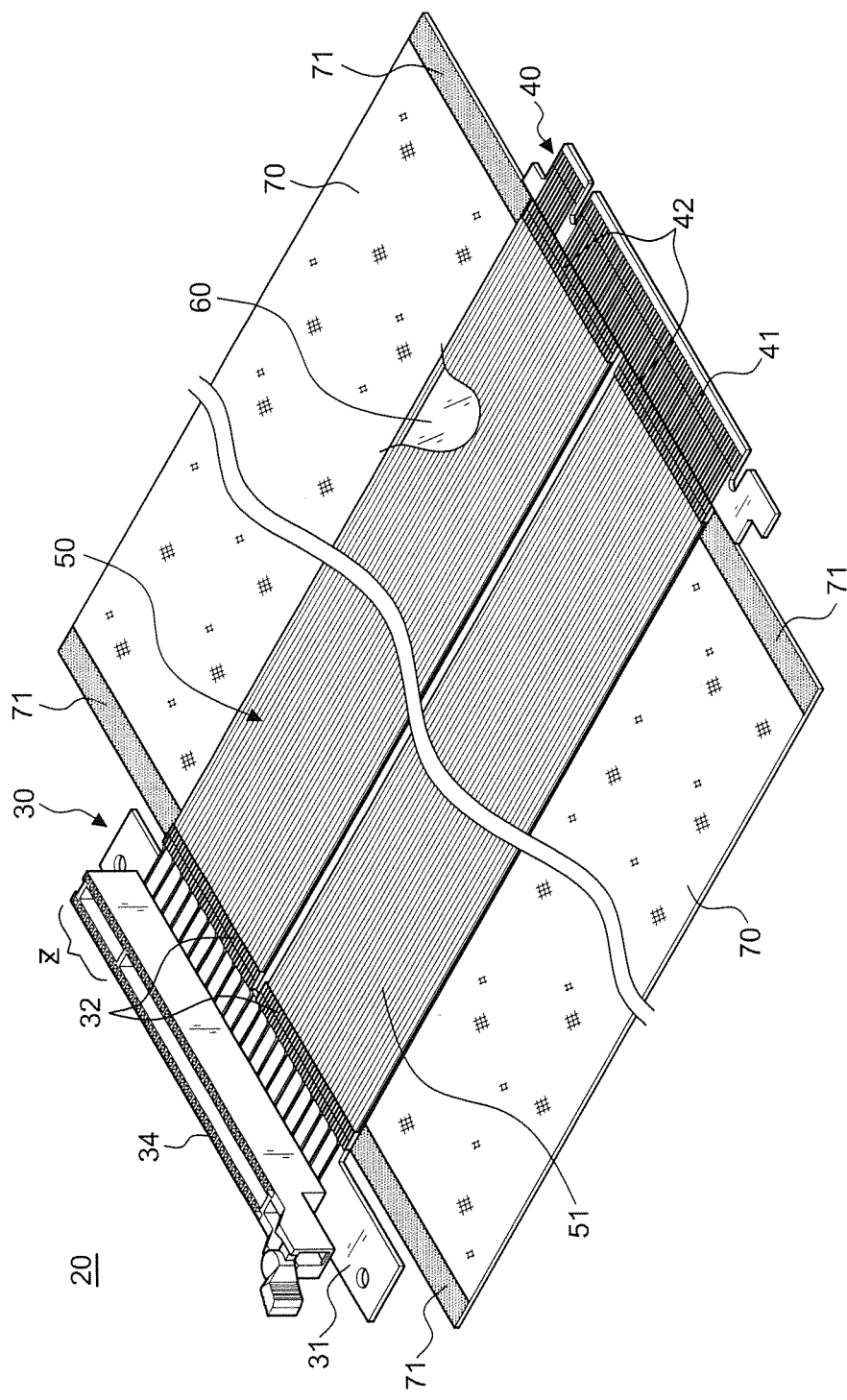
FIG. 5 is a schematic diagram of the present invention of unfolded conductive adhesive tapes and flat cable group.
Figure 6:
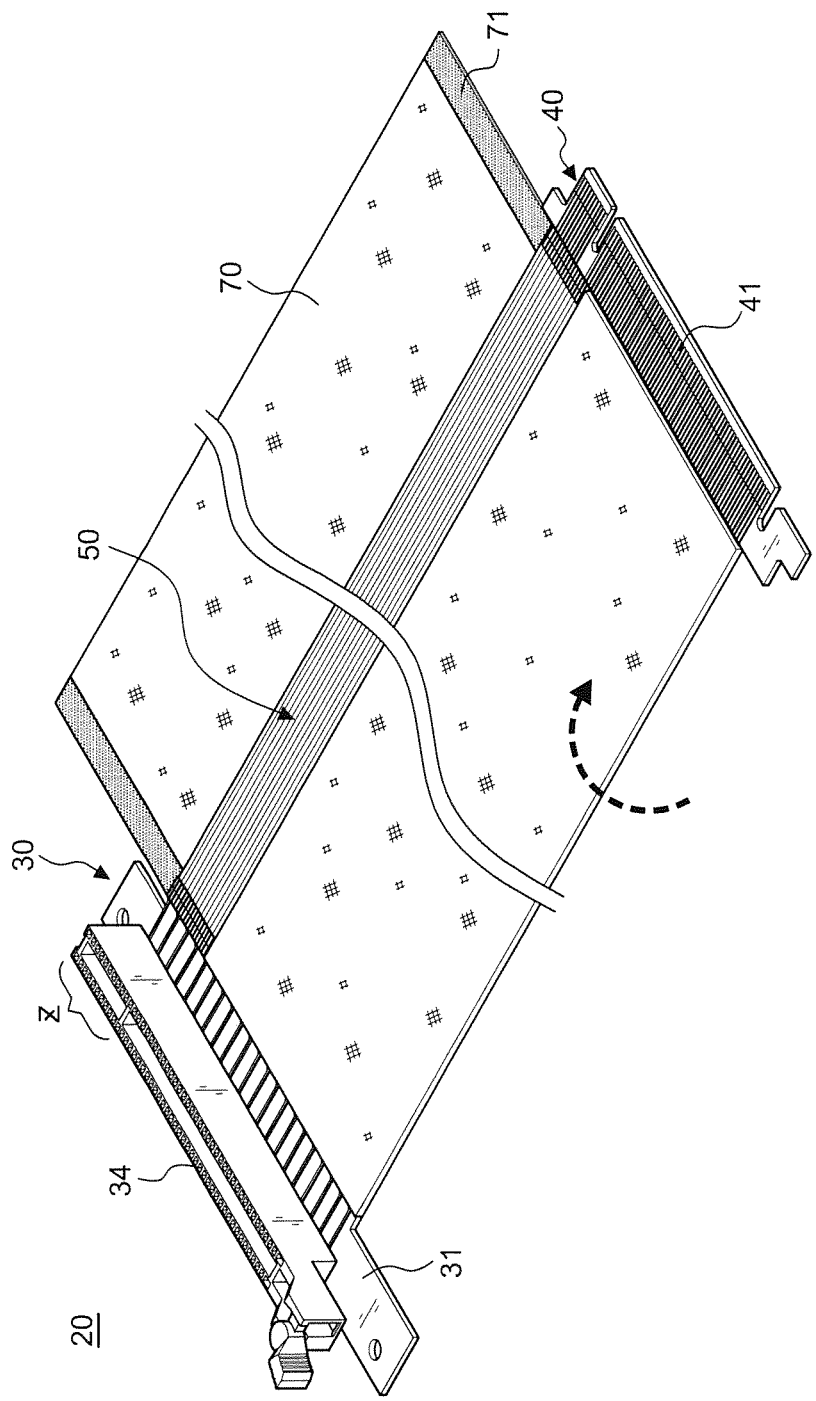
FIG. 6 is a schematic diagram of the present invention illustrating a strip of conductive adhesive tape covering the flat cable group.
Figure 7:
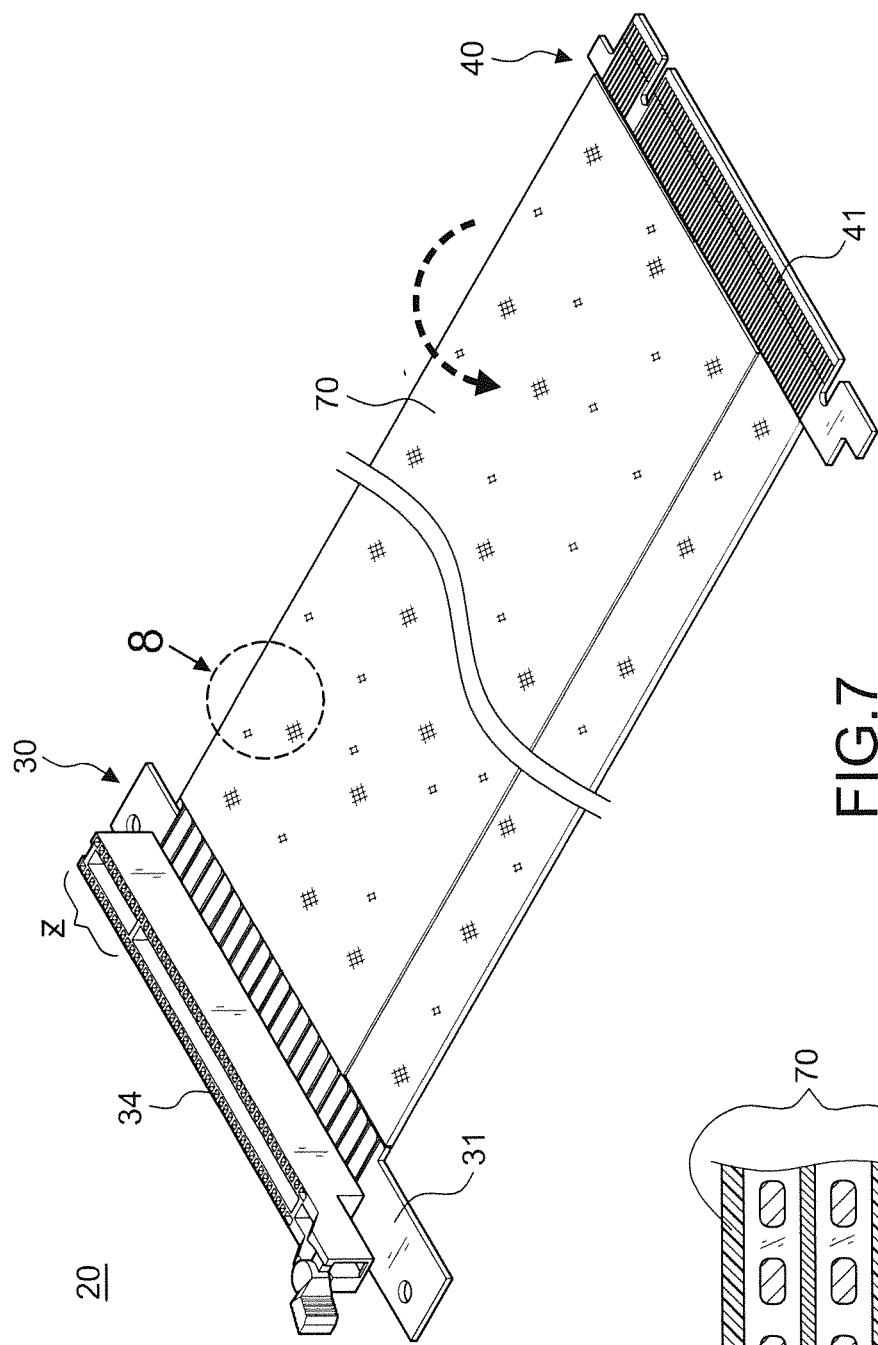
FIG. 7 is a schematic diagram of the present invention illustrating the flat cable group completely covered by conductive adhesive tapes.
Figure 8:
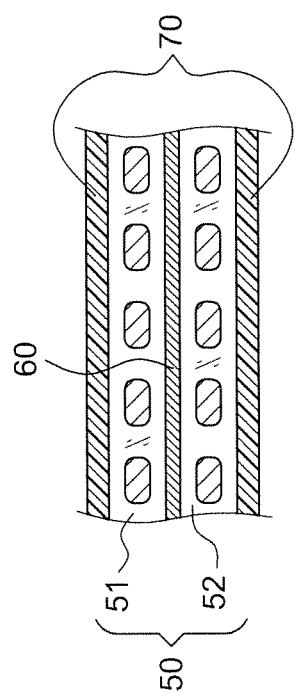
FIG. 8 is a partially enlarged sectional view of FIG. 7.

Referring to FIGS. 2, 3, and 4A, the preferred embodiment has two conductive metal foil sheets 60 arranged between the upper and lower flat cables 51, 52 and 53, 54 respectively, and the width W of the conductive metal foil sheets 60 is practically the same as the width of the flat cables. However, the present invention is not limited to such construction. As shown in FIG. 4B, it is also applicable to arrange only one piece of conductive metal foil sheet 60 between two of the flat cables 51, 52. Additionally, another applicable arrangement is shown in FIG. 4C. There is only one piece of the conductive metal foil sheet 60 with a width W covering the area Z as the power supply loop of the flat cable group 50, so as to isolate the area of the upper and lower flat cables 51, 52 adopted as the power supply loop. Thus, the magnetic field caused by the DC circuit within the area Z as the power supply loop could be conducted into ground wires via the conductive metal foil sheet 60 and therefore the most influential factor that may affect I/O signals is eliminated. In this preferred embodiment, the conductive metal foil sheet 60 made of cooper is the most effective, and it is even better to have adhesive 61 on either side of it to be arranged between the upper and lower double layer flat cables, 51, 52 and 53, 54 more easily. Said adhesive 61 can be either spread or pasted partially or entirely on the conductive metal foil sheet 60.

Further, in FIGS. 5-8, the present invention has a conductive adhesive tape 70 with high frequency shielding effects wrapping the entire double layer flat cable group 50 to minimize the loss of high frequency signals. In the preferred embodiments, the inner side of said conductive adhesive tape 70 is arranged with an insulation layer 71 on each side relative to position of the connecting pins 51, 52 and 53, 54, and the insulation layer 71 could be made from insulating tapes. Thus, the electrical connection would not be influenced when the flat cable group 50 is wrapped in conductive adhesive tape 70. Certainly, the insulation layer 71 is not limited to be arranged on the inner side of the conductive adhesive tape 70; covering the connecting pins with insulating tapes is also applicable.

The present invention disperses the magnetic field effects caused by the DC supply loop via the conductive metal foil sheet 60 and conducts into ground wires, so as to eliminate the most influential factor that may affect I/O signals and minimize high-frequency signals loss due to outward sending process by means of wrapping the double-layer flat cable with a conductive adhesive tape 70 which has a high frequency shielding effect. The transmission disorder caused by paralleling and overlapping of high-frequency signals and power supply loop is effectively eliminated.

Even more, the conductive metal foil sheet 60 and conductive adhesive tape 70 are in thickness between the range of 0.1 mm to 0.3 mm, making no influence on flexibility or bending resistance of the flexible cable. This is a feature you cannot find in the conventional flat cables of Flexible Print Circuit. In addition, the present invention has an advantage of low cost, and it is mainly placed inside personal computers or servers, so a length of 25 cm is enough for practical usages. The length is also the same as the one of the experimental prototype. A comparison between the experimental prototype of the present invention and a conventional flexible cable applied in different architectures of PCI Express is listed as below. ('✓' means applicable; 'x' means inapplicable)

| PCIe architecture | Interconnect bandwidth | Bandwidth per lane per direction | Total bandwidth for ×16 link | Raw bit rate | A conventional flexible cable | Prototype of the present invention |
|---|---|---|---|---|---|---|
| 1.0 | 2 Gb/s | 250 MB/s | 8 GB/s | 2.5 GT/s | ✓ | ✓ |
| 1.1 | 2 Gb/s | 250 MB/s | 8 GB/s | 2.5 GT/s | ✓ | ✓ |
| 2.0 | 4 Gb/s | 500 MB/s | 16 GB/s | 5.0 GT/s | ✓ | ✓ |
| 2.1 | 4 Gb/s | 500 MB/s | 16 GB/s | 5.0 GT/s | ✓ | ✓ |
| 3.0 | 8 Gb/s | 1 GB/s | 32 GB/s | 8.0 GT/s | X | ✓ |
| 4.0 | Estimated to be disclosed in 2014-2015 | | | 16.0 GT/s | X | unknown |

From the table above, it can be concluded that the adapter of conventional flexible cables are applicable to PCIe 1.0, but when the architecture is upgraded to PCIe 3.0, an adapted display card could not be initialized; in other words, it is inapplicable. On the other hand, the double-layer flat cable adapter card 20, as the present invention, is applicable in architectures PCIe 1.0 to PCIe 3.0. Even though there is a PCIe 3.0 adapter for PCIe 3.0 made of Flexible Print Circuit types, it still lacks advantages of no lagging or filed loss of high frequency signals, and low cost with excellent flexibility and bend resistance which the present invention does have. These advantages are those Flexible Print Circuits unable to accomplish.

As stated above, the present invention disperses the magnetic field effects by placing the conductive metal foil sheet in the DC supply loop and conducts into ground wires, to eliminate the most influential factor that may affect I/O signals and minimize high-frequency signals loss due to outward sending process by means of wrapping the double-layer flat cable in conductive adhesive tape which has a high frequency shielding effect. The present invention not only initializes the latest PCIe 3.0 display card well, but has passed testaments of multiple software to prove itself being effectively able to eliminate problems such as transmission disorders and signal loss caused by some characteristics of materials in high frequency signals transmission process; the interconnect bandwidth is upgraded from the original 4 Gb/s in PCI_Express 2.0 to 8 Gb/s in PCI_Express 3.0 as well. As PCI_Express 3.0 is currently the latest architecture in data transmission via computer peripheral devices, the present invention is obvious the latest technology to deal with the transmission problems of the latest and highest standard display card with proofs of testament results in the practical field.

Although particular embodiments of the invention have been described in details for purposes of illustration, various modifications and enhancements may be made without departing from the spirit and scope of the invention. Accordingly, the invention is not to be limited except as by the appended claims.

What is claimed is:

1. A high-frequency signal double-layer flat cable adapter card, particularly a double-layer flat cable adapter card that is capable of eliminating transmission disorder of a double-layer cable caused by paralleling and overlapping of high-frequency signals and a DC supply loop, comprising
    a first connecting end, including a first substrate and a connector; said first substrate has a first connecting pin and a second connecting pin set on its front and rear sides respectively;
    a second connecting end, including a second substrate with a third connecting pin and a fourth connecting pin set on its front and rear sides respectively; and
    a flat cable group including a minimum of two flat cables arranged as upper-lower double layer and connected between said first and second connecting ends, said first flat cable, as the upper layer, has its front and back ends electrically connected to the first connecting pin of said first substrate and the third connecting pin of said second substrate respectively, and the second flat cable, as the lower layer, has its front and back ends electrically connected to the second connecting pin of said first substrate and the fourth connecting pin of said second substrate respectively;
    wherein said flat cable group has a fine conductive metal foil sheet arranged between the upper and lower flat cables with a width covering areas of said flat cable group adopted as a power supply loop to isolate the magnetic field effect in the areas of said upper and lower flat cables adopted as a power supply loop; and a conductive adhesive tape with high frequency shielding effects wraps the entire double-layer flat cable group to minimize the loss of high frequency signals.

2. The high-frequency signal double-layer flat cable adapter card as claimed in claim 1, wherein said conductive metal foil sheet is made of cooper.

3. The high-frequency signal double-layer flat cable adapter card as claimed in claim 2, wherein said flat cable group could include four flat cables as a third flat cable, as the upper layer, and a fourth flat cable, as the lower layer, set parallel to said upper-lower double layer flat cable group of said first and second flat cable, so as to construct a high-frequency signal adapter of four flat cables with a paralleling twofold flat cable group, each has two overlapping flat cables.

4. The high-frequency signal double-layer flat cable adapter card as claimed in claim 3, wherein a conductive metal foil sheet could be further arranged between the third flat cable and the fourth flat cable; said conductive metal foil sheet is made of cooper.

5. The high-frequency signal double-layer flat cable adapter card as claimed in claim 4, wherein said conductive metal foil sheet has adhesive on either side of it.

6. The high-frequency signal double-layer flat cable adapter card as claimed in claim 5, wherein the inner side of said conductive adhesive tape is arranged with an insulation layer on both sides relative to position of the connecting pins.

7. The high-frequency signal double-layer flat cable adapter card as claimed in claim 6, wherein said insulation layer is made of an insulating tape.

* * * * *